(12) United States Patent
V et al.

(10) Patent No.: US 8,599,551 B1
(45) Date of Patent: Dec. 3, 2013

(54) THERMAL MANAGEMENT AND CONTROL USING AN INVERTED HEAT-PIPE WITH A COMMON VAPOR CHAMBER BASE

(75) Inventors: Ravichandran V, Bangalore (IN); Rajendra Yammanuru, Bangalore (IN)

(73) Assignee: Juniper Networks, Inc., Sunnyvale, CA (US)

(*) Notice: Subject to any disclaimer, the term of this patent is extended or adjusted under 35 U.S.C. 154(b) by 313 days.

(21) Appl. No.: 13/086,701

(22) Filed: Apr. 14, 2011

(51) Int. Cl.
*H05K 7/20* (2006.01)

(52) U.S. Cl.
USPC ..................................... 361/679.47

(58) Field of Classification Search
USPC .............. 361/676–678, 679.46–679.54, 361/688–691, 694–697, 700–704, 707, 361/709–710
See application file for complete search history.

(56) References Cited

PUBLICATIONS

Thermacore, Inc., "Heat Pipe Technology: Passive Heat Transfer for Greater Efficiency", Mar. 10, 2011 (print date), 2 pages.
Thermacore, Inc., "Heat Pipe Assemblies: A Wide Range of Efficient Cooling Solutions", Mar. 10, 2011 (print date), 3 pages.
Thermacore, Inc., "Advanced Solid Conduction: Greater Conductivity, Lower Mass", Mar. 10, 2011 (print date), 2 pages.
ElectronicsCooling Online, "Low Profile Heat Sink Cooling Technologies for Next Generation CPU Thermal Designs", Feb. 17, 2005, 11 pages.

*Primary Examiner* — Courtney Smith
(74) *Attorney, Agent, or Firm* — Harrity & Harrity, LLP (57) ABSTRACT

A cooling system includes a heat sink to absorb heat that is generated by a component of a device, where the heat sink includes a base to dissipate the heat, and a group of fins via which the heat, that is dissipated by the base, is transferred; and an inverted heat sink to receive the heat via the fins. The inverted heat sink includes another base to prevent a portion of the heat, transferred into an environment where another component is located, from causing a temperature, of the environment, to increase above a threshold; a heat pipe to transfer another portion of the heat, not transferred into the environment, to a portion of the other base; and another group of fins to receive the other portion of the heat via the portion of the other base. The inverted heat sink is also to transfer the other portion of the heat to another environment to prevent a temperature, of the component, from increasing above another threshold.

24 Claims, 8 Drawing Sheets

THERMAL MANAGEMENT AND CONTROL USING AN INVERTED HEAT-PIPE WITH A COMMON VAPOR CHAMBER BASE

BACKGROUND

Public and/or proprietary networks carry more and more traffic using network devices that process the traffic at ever increasing bandwidths, data rates, processing speeds, etc. To achieve these bandwidths, data rates, processing speeds, etc., network devices have been equipped with more complex and/or a greater quantity of high performance components, such as higher speed processors, higher capacity switches, faster memories, and/or other components that have improved the performance of the network devices over earlier versions of the network devices.

The components that are capable of higher performance often generate more heat than the components that they replace. Additionally, the greater quantity of components can cause circuit board component density to increase, which generates more heat within a particular volume within the network devices. Unfortunately, the network devices are not always capable of dissipating the heat, within the particular volume, without a modification that increases a cost associated with the network device.

SUMMARY

According to one aspect, a cooling system implemented within a device may include a heat sink to absorb heat that is generated by a component of the device, where the heat sink may include a first heat sink base to dissipate the heat, and a first group of fins via which the heat, that is dissipated by the first heat sink base, is transferred. The cooling device may also include an inverted heat sink to receive the heat via the first group of fins. The inverted heat sink may include a second heat sink base to ensure that a portion of the heat, that transfers into an environment in which another component associated with the network device is located, does not cause a temperature, associated with the environment, to increase to a first level that is greater than a first threshold. The inverted heat sink may also include a set of heat pipes to transfer another portion of the heat, that does not transfer into the environment, to a portion of the second heat sink base. The inverted heat sink may further include a second group of fins that may receive the other portion of the heat via the portion of the second heat sink base and may transfer the other portion of the heat to another environment to prevent a temperature, associated with the component, from increasing to a second level that is greater than a second threshold.

According to another aspect, a cooling system implemented within a device may include a base on which to mount a first component of the device; and a group of heat sinks to dissipate heat that is generated by the group of components, where at least one of the group of heat sinks is mounted to the base that creates a mounting area to which the first component is mounted. The system may also include a group of inverted heat sinks installed on the heat sinks in a manner that does not increase the mounting area. Each of the group of inverted heat sinks may receive a respective portion of the heat that is dissipated by the group of heat sinks and may block part of the respective portion of the heat from being transferred to an airflow that is incident on a second component, where blocking the part of the respective portion of the heat may prevent performance of the second component from degrading. Each of the group of inverted heat sinks may also transfer another part of the respective portion of the heat to another airflow to cool each of the group of inverted heat sinks, where cooling each of the group of inverted heat sinks enables the group of components to operate at a temperature that is lower than a threshold.

According to yet another aspect, a cooling system implemented within a device may include a base on which a component is mounted, the base being made of a thermally conductive material that includes a vapor chamber. The cooling system may also include one or more heat sinks that include one or more heat sink bases and one or more groups of fins, where a particular heat sink, of the one or more heat sinks, is mounted to the base within a mounting area in which the component is mounted, and where a particular heat sink base, associated with the particular heat sink, is connected to at least one group of fins of the one or more group of fins. The cooling system may further include one or more inverted heat sinks that include one or more inverted heat sink bases and one or more groups of inverted fins. A first inverted heat sink of the one or more inverted heat sinks may be mounted to the base in a manner that does not increase the mounting area; may include a first inverted heat sink base, of the one or more inverted heat sink bases, on which another component is mounted; may include a particular group of inverted fins, of the one or more groups of inverted fins, the particular group of inverted fins being connected to a portion of the first inverted heat sink base; and one or more heat pipes associated with the first inverted heat sink.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

The systems and/or methods, described herein, may enable a component, associated with a computing and/or communication device, to be cooled in a manner that reduces a quantity of heat that is transferred into an environment where the component is located. Reducing the quantity of heat that is transferred into the environment may decrease a quantity of heat flux that is incident on an adjacent component located downstream of the component. Decreasing the quantity of heat flux that is incident on the adjacent component may reduce a temperature, associated with the adjacent component. The reduced temperature may prevent damage to the adjacent component or avoid degrading performance of the adjacent component. Transfer of heat, as described herein, may correspond to heat that is transferred via conduction, convection, radiation, and/or another mechanism for transferring heat.

The term heat flux, as used herein, may include a quantity of thermal energy (e.g., heat) that is transferred by the component, a cooling device, and/or cooling system as measured over a particular area. Heat flux may, in one example, be associated with a quantity of heat, which is generated by the component and/or is emitted by the cooling device and/or system, that flows toward and/or is incident on the adjacent component (referred to herein as a "downstream component"). The term component, as used herein, may be any part, element, device, module, etc. that generates heat and/or transfers heat into an environment. In one example, a component may be associated with a computing device (such as, for example, a power supply module, an integrated circuit chip, an application specific integrated circuit (ASIC), a field programmable array (FPGA), etc.).

In one implementation, a component may be mounted to a heat sink, such as a heat sink with a solid base and/or a vapor chamber, in order to cool the component during operation. The heat sink may sufficiently cool the component (e.g., to a temperature that is below a threshold). However, a portion of heat that is dissipated by the heat sink may be transferred into an environment surrounding the component. The heat that is transferred into the environment may create a heat flux that is incident on a downstream component, which may cause a temperature, associated with the component, to increase to a level that is above a threshold.

In another implementation, another heat sink may be installed one the heat sink in order to reduce the quantity of heat that is transferred into the environment. Reducing the quantity of heat that is transferred into the environment may reduce a quantity of the heat flux that is incident on the downstream component. The other heat sink may be installed in an inverted manner, relative to the heat sink. The inverted heat sink may, in one example, be installed such that cooling fins (e.g., inverted cooling fins), associated with the inverted heat sink, are adjacent to and/or interlaced with other cooling fins associated with the heat sink. The inverted cooling fins may be connected to an inverted base associated with the inverted heat sink. The addition of the inverted heat sink may enable a greater quantity of heat that is generated by the component to be dissipated. The addition of the inverted heat sink may act as a shield and/or may otherwise reduce the quantity of heat that is transferred into the environment. While the addition of the inverted heat sink may reduce the quantity of heat that is transferred, the addition of the heat sink may also impede the air flow in the vicinity of the component and/or the heat sink. Impeding the air flow may cause temperatures, associated with the inverted and/or convention heat sink to increase to a level that degrades performance of the component.

In yet another implementation, a modified inverted heat sink may be installed in order to compensate for the increased temperatures caused by the impeded air flow. In one example, the modified inverted heat sink may include one or more heat pipes to transfer heat, stored in the inverted based and/or inverted fins, to another environment, such as a cooler environment, ambient air, etc. In one example, the other environment may be remote from the environment.

In another implementation, multiple components may be cooled using a stacked cooling system that includes one or more heat sinks, one or more inverted heat sinks, and/or one or more modified inverted heat sinks. The stacked cooling system may enable an increased quantity of components to be cooled within the environment.

A common base may be used when the cooling system associated with the inverted heat sink, the modified inverted heat sink, and/or the stacked cooling system is used. The additional cooling capacity that is provided by the addition of one or more inverted heat sinks may be realized without expanding a mounting area associated with the heat sink. For example, the inverted heat sink, the modified inverted heat sink, and/or the stacked cooling system may not be mounted to a base on which the component and/or the heat sink are mounted. Additionally, or alternatively, the additional cooling capacity, within the environment may be achieved without installing additional bases on which to mount the inverted heat sink, modified inverted heat sink, and/or stacked cooling system. Thus, the common base may be used to provide the increased cooling capacity without increasing a mounting area and/or without using the additional bases, which may reduce a cost of the network device.

Figure 1A:
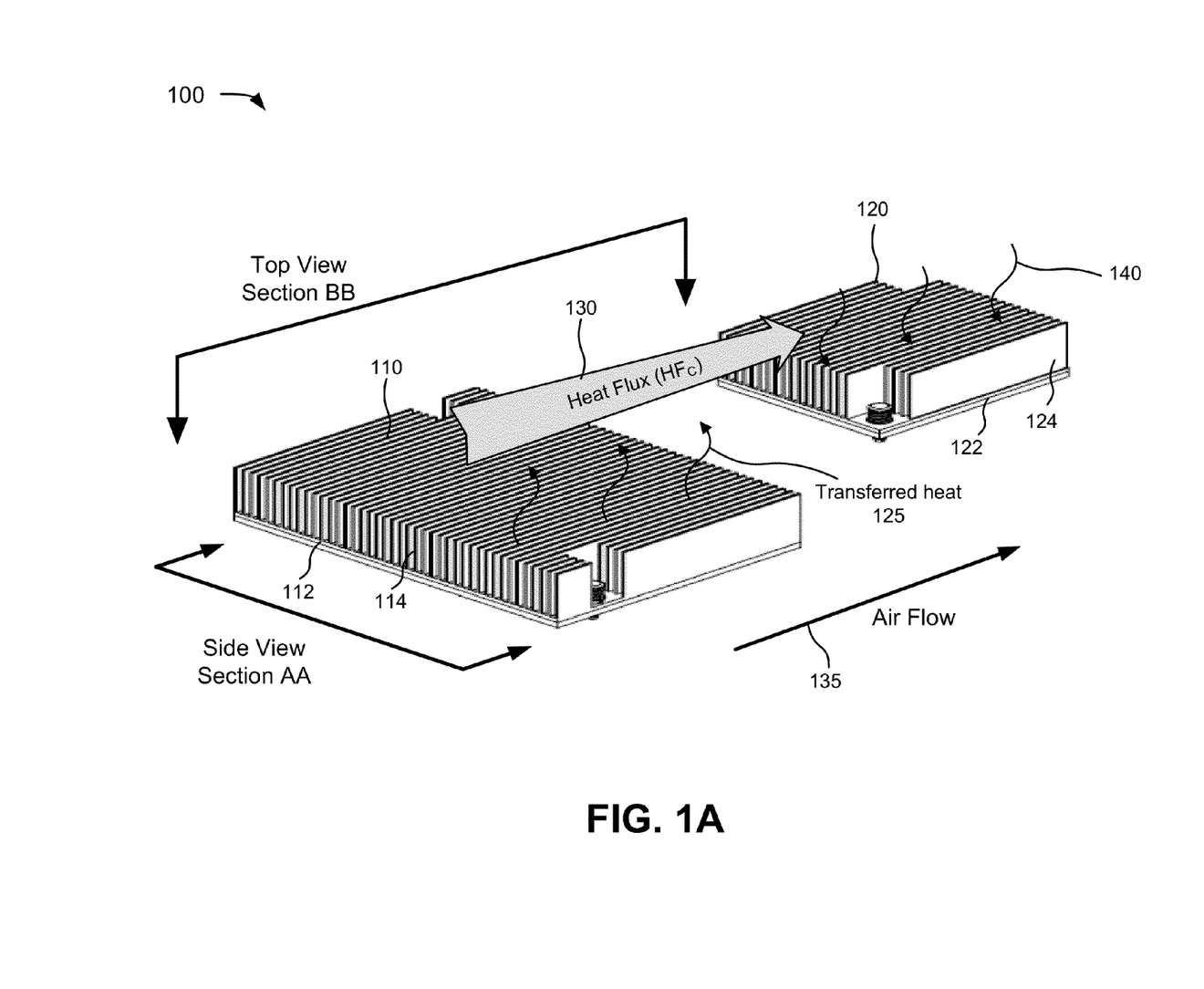
FIGS. 1A and 1B are diagrams of an overview of a component cooling system and a modified component cooling system, respectively, according to an implementation described herein.
Figure 1B:
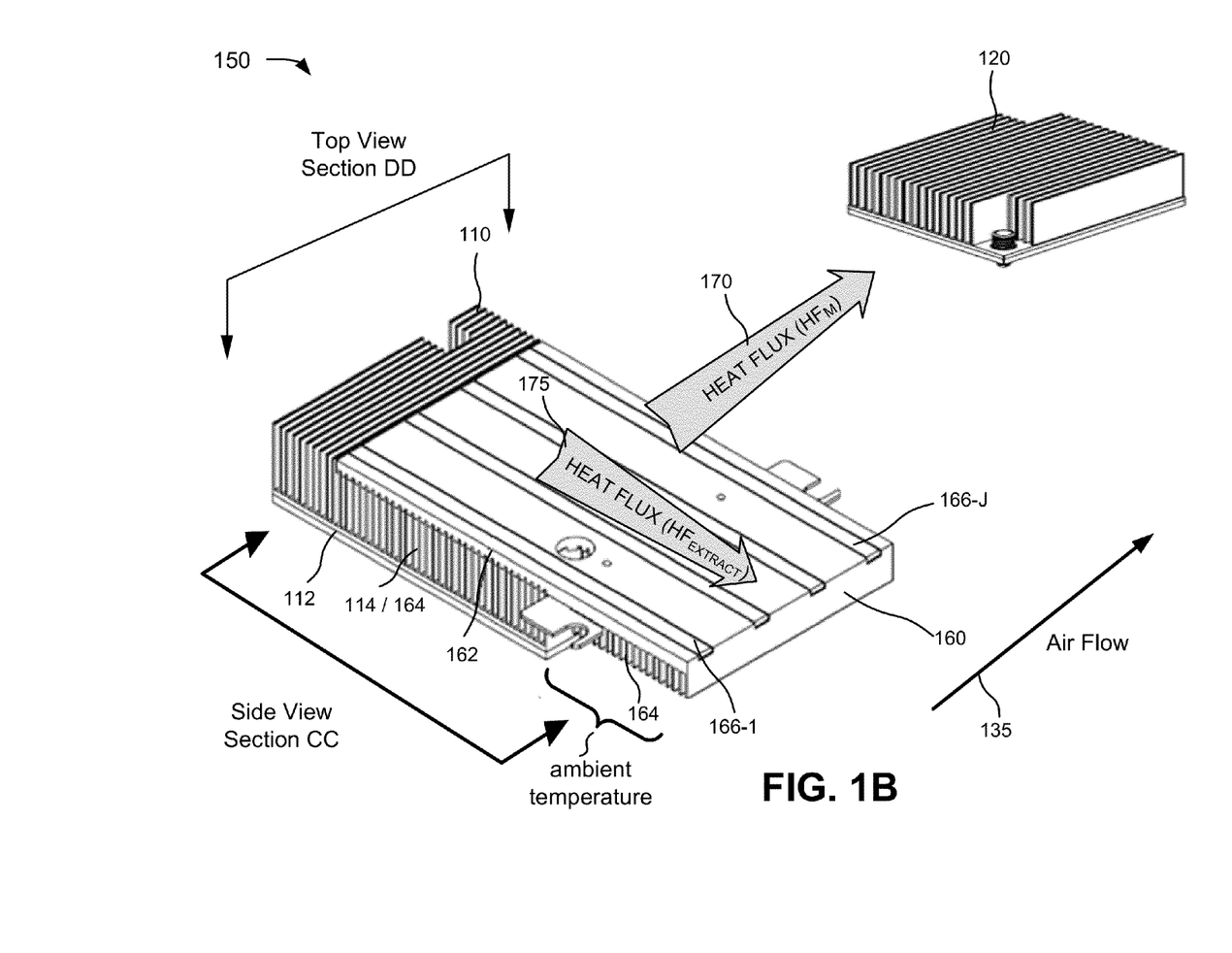

FIGS. 1A and 1B are diagrams of an overview of a network device component cooling system 100 (hereinafter referred to as "cooling system 100") and a modified network device component cooling system 150 (hereinafter referred to as "modified cooling system 150"), respectively, according to an implementation described herein. As shown in FIG. 1A, cooling system 100 may include a heat sink 110 and a downstream heat sink 120. Heat sink 110 may include one or more devices that absorb heat from a component associated with a network device for dissipation over a surface area and/or environment associated with heat sink 110. Heat sink 110 may be mounted to the component (e.g., not shown in FIG. 1A) in order to absorb heat that is generated from and/or emitted by the component. Heat sink 110 may include a heat sink base 112, and a group of fins 114 (hereinafter referred to collectively as "fins 114" and individually as "fin 114").

Heat sink base 112 may be a component that is capable of being mounted to a component in a manner that enables heat sink 110 to absorb heat that is generated and/or emitted by the component. Heat sink based 112 may be capable of securing the group of fins 114. Heat sink base 112 may, in one example, be a solid material, such as copper, aluminum, etc., that is capable of absorbing and/or conducting heat. For example, heat sink base 112 may be made of a thermally conductive material that has a coefficient of thermal conductivity that is less than a threshold.

In another example, heat sink base 112 may include a cavity within the material (e.g., a hollow chamber, a manifold, etc.). In one example, heat sink 112 may be a vapor chamber-based heat sink. In another example, heat sink 112 may be a heat pipe-based heat sink. The cavity may be lined with a wicking material that is filled with a working fluid (e.g., water, alcohol, acetone, etc.) which exists in a liquid and/or vapor state within the cavity. The working fluid may absorb heat, received from the component via the material, which may cause the liquid to evaporate into a vapor. The vapor may flow within the cavity (e.g., based on convection) and may distribute the heat to a cooler region of the base material and/or fins 114. When distributing the heat to the cooler region, the vapor may condense back to a liquid state and may flow back to a hot region via the wicking material.

Fins 114 may include a group of plates that are secured to heat sink base 112. Fins 114 may be made of a thermally conductive material (e.g., copper, aluminum, etc.) that is capable of absorbing heat, conducting heat, and/or dissipating heat into a surrounding environment and/or heat sink base 112. Fins 114 may, for example, be secured to heat sink base 112 in a manner that enables fins 114 to absorb heat from heat sink base 112 and/or to distribute the heat throughout a volume and/or surface area of each of fins 114. Fins 114 may be configured in a manner that maximizes a surface area via which the heat may be transferred into the environment, such as the atmosphere or a fluid (e.g., as in a radiator, etc.), while ensuring enough durability to withstand damage caused by tools, solvents, etc.

Downstream heat sink 120 may include one or more devices that absorb heat from a component associated with the network device for dissipation over a surface area and/or volume associated with downstream heat sink 120. In an example implementation, downstream heat sink 120 may be mounted to the other component (e.g., not shown in FIG. 1A) in order to absorb heat that is generated by and/or emitted from the other component. Downstream heat sink 120 may include a downstream heat sink base 122, and fins 124. Downstream heat sink base 122 and/or fins 124 may be similar to and/or act in a manner that is similar to heat sink base 112 and/or fins 114, respectively.

Heat sink 110 may absorb heat that is generated by the component when the component is operating. Heat sink 110 may dissipate a portion of the absorbed heat (e.g., shown as transferred heat 125) into the surrounding environment. The transferred heat may flow in a direction that corresponds to downstream heat sink 120 (e.g., shown as block arrow 130 annotated as "Heat Flux ($HF_c$)," where $HF_c$ corresponds to a quantity of heat flux associated with the cooling system 100)). The direction of the heat flux may be caused by a particular direction of flow (e.g., shown as airflow arrow 135), associated with the surrounding environment, such as from convention, a cooling fan, etc.

The heat flux may impinge on downstream heat sink 120, which may be absorbed by downstream heat sink 120 via fins 124 (e.g., as shown by absorbed heat 140). The absorbed heat may cause heat sink 120 to increase in temperature to a level that is greater than a threshold. When the temperature is greater than the threshold, the other component, on which downstream heat sink is installed, may be damaged or cease to work properly.

As shown in FIG. 1B, modified cooling system 150 may include one or more devices described above with respect to FIG. 1A (e.g., heat sink 110 and/or downstream heat sink 120) and may include inverted heat sink 160. Inverted heat sink 160 may include inverted heat sink base 162 (hereinafter referred to as "inverted base 162"), a group of inverted fins 164 (hereinafter referred to collectively as "inverted fins 164" and individually as "inverted fin 164"), and a collection of heat pipes 166-1, . . . 166-J (where J≥1) (hereinafter referred to collectively as "heat pipes 166" and individually as "heat pipe 166").

Inverted base 162 may include a component that is capable of being mounted to another component and/or another heat sink (e.g., heat sink 110 of FIG. 1A) in a manner that enables inverted heat sink 160 to absorb heat that is generated and/or emitted by the other component and/or the other heat sink. Inverted based 162 may be capable of securing fins 164. Inverted base 162 may, in one example, be a solid material that is capable of absorbing and/or conducting heat (e.g., copper, aluminum, etc.). In another example, inverted base 162 may, in a manner similar to that described above (e.g., with respect to FIG. 1A), include a cavity within the material that corresponds to a vapor chamber-based heat sink.

Inverted fins 164 may include a group of plates that are secured to inverted base 162. Inverted fins 164 may be made of a thermally conductive material (e.g., copper, aluminum, etc.) that is capable of absorbing heat, conducting heat, and/or dissipating heat into a surrounding environment, heat sink base 162, and/or heat pipes 166. Inverted fins 164 may, for example, be secured to inverted base 162 in a manner that enables inverted fins 164 to absorb heat from and/or dissipate heat to inverted base 162 and/or heat pipes 166. Fins 164 may be configured in a manner that maximizes a surface area via which heat may be absorbed from heat sink 110 while ensuring enough durability to withstand damage caused by tools, solvents, etc. that are used within an environment in which inverted heat sink 160 operates. Additionally, or alternatively, inverted fins 164 may be configured in a manner that enables inverted fins 164 to be interlaced between fins 114 when inverted heat sink 160 is installed on heat sink 110.

Heat pipe 166 may include one or more components that are capable of controlling a manner and/or direction in which heat is transferred. In an example implementation, heat pipe 166 may exist within a material associated with inverted based 162. Heat pipe 166 may be a cylindrical cavity, such as a tube or manifold, via which heat is transported within inverted base 162 and/or to another heat sink. Heat pipe 166 may, in a manner similar to that described above (e.g., with respect to FIG. 1A), be lined with a wicking material that is filled with a working fluid which exists in a liquid and/or vapor state within the cavity. The working fluid may enable heat to be transferred from a warmer region of inverted heat sink 160 to a cooler region of inverted heat sink 160 via the cylindrical cavity.

Inverted heat sink 160 may be installed on heat sink 110. For example, when installed, inverted base 162 may be in contact with and/or attached to all or a portion of fins 114 of heat sink 110. In another example, inverted base 162 may include a portion of fins 164 that are adjacent to and/or interlaced with fins 114 of heat sink 110.

Inverted heat sink 160 may absorb heat that is transferred from heat sink 110. For example, inverted base 162 may absorb the heat via fins 114 and/or via the portion of inverted fins 164 that are adjacent to and/or interlaced with fins 114. Inverted base 162 may dissipate the heat throughout inverted based 162 and may transfer a portion of the heat to heat pipes 166. Heat pipes 166 may receive the portion of the heat and may transfer the heat to cooler regions of inverted heat sink 160. In one example, another portion of fins 164 may be exposed to an environment (e.g., the atmosphere, a fluid, etc.) that is cooler (e.g., as shown by the bracket entitled ambient temperature) than a portion of inverted base 162 that is in contact with and/or attached to fins 114. The other portion of fins 164, that is exposed to the ambient air, may receive the heat via inverted base 162 and/or heat pipes 166 and may transfer all or a portion of the received heat into the ambient air.

Inverted base 162 may act as a shield by "trapping" a portion of the heat, that would otherwise have been transferred into the surrounding environment, between inverted base 162 and heat sink base 112. Trapping a portion of the heat that would otherwise have been transferred into the environment may cause a heat flux (e.g., as shown by block arrow 170 annotated as "Heat Flux ($HF_M$)," where $HF_M$ corresponds to a quantity of heat flux associated with modified cooling system 150) to be reduced to a level that is less than the heat flux associated with heat sink 110 of FIG. 1A (e.g., where HFM<HFC). The heat flux associated with modified cooling system 150 that impinges on downstream heat sink 120 may enable a temperature associated the other component to be reduced to a safe operating level (e.g., less than a threshold).

All or a portion of the trapped heat may be dissipated within a volume associated with inverted base 162 and/or may be transferred to the other portion of fins 164 that are exposed to the ambient temperature. Dissipating the trapped heat within inverted base 162 and/or transferring the trapped heat to the ambient temperature (e.g., via heat pipes 166 and/or the other portion of fins 164) may correspond to an extracted heat flux (e.g., shown as block arrow 175 entitled "Heat Flux ($HF_{EXTRACT}$)). The extracted heat flux may enable a temperature of inverted heat sink 160 and/or heat sink 110 to be reduced to a level that is less than a threshold.

The number of devices, illustrated in FIGS. 1A and 1B, is provided for explanatory purposes only. In practice, there may be additional devices, fewer devices, different devices, or differently arranged devices than illustrated in FIGS. 1A and 1B. Also, in some implementations, one or more of the devices of cooling system 100 of FIG. 1A and/or modified cooling system 150 of FIG. 1B may perform one or more functions described as being performed by another one or more of the devices of cooling system 100 and/or modified cooling system 150, respectively.

Figure 2A:
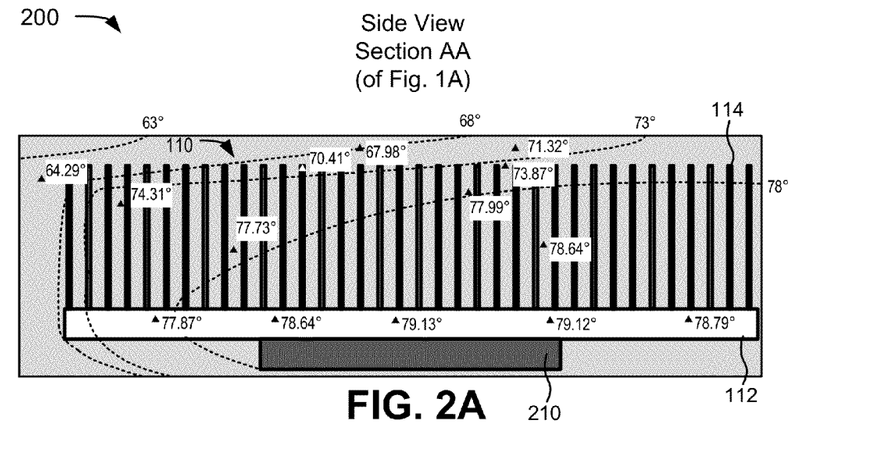
FIGS. 2A and 2B are diagrams of example thermal characteristics associated with the component cooling system of FIG. 1A.

FIGS. 2A and 2B are diagrams of example thermal characteristics graphs 200 and 250, respectively, of cooling system 100. As shown in FIG. 2A, thermal characteristics graph 200 may be associated with side view section AA (FIG. 1A) of cooling system 100. Thermal characteristics graph 200 may represent operating temperatures associated with heat sink 110 and/or an environment in the immediate vicinity surrounding heat sink 110 as a result of heat being transferred from component 210. Component 210 may include one or more components, associated with a network device, that generate heat when operating. In one example, component may be a chip that houses an integrated circuit, such as a microprocessor, an application specific integrated circuit (ASIC), a field-programmable gate array (FPGA), etc.

Thermal characteristics graph 200 may include a temperature topology as identified by lines of constant temperature (hereinafter referred to as "isotherms," which are shown as dashed lines labeled as 63°, 68°, 73° and 78° Celsius (° C.)). Thermal characteristics graph 200 may also include particular locations, within side view section AA, at which temperature was measured (hereinafter referred to collectively as "temperature points" and individually as "temperature point").

The isotherms and/or temperature points may be used to identify relative quantities of heat, transferred from component 210, at various locations of heat sink 110. For example, 78° isotherm and/or a group of temperature points (e.g., from left to right, 78.64°, 79.13°, 77.99°, 78.64°, 79.12°, and/or 78.79°) may identify a relatively hot region, associated with heat sink 110, that encompasses a portion of heat sink base 112 and fins 114 and is generally greater than 78°. Isotherms of 63° and 68° and/or another group of temperature points (e.g., from left to right, 64.29° and/or 67.98°) may identify a relatively cool region that does not encompass heat sink 110. A warm region that lies between the cool region and the hot region may be identified as a region between isotherms of 68° and 78° (e.g., which includes an isotherm associated with 73°) that includes a further group of temperature points (e.g., from left to right, 74.31°, 77.87°, 77.73°, 70.41°, 73.87,° and/or 71.32°). The warm and/or hot region may indicate a manner in which air, associated with the cooler region, is being warmed by heat being emitted from heat sink 110.

Figure 2B:
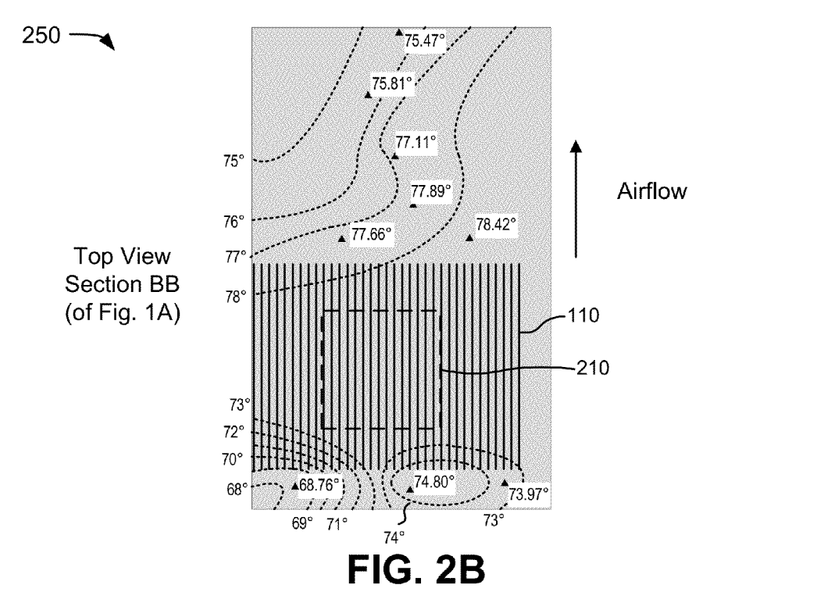

FIG. 2B illustrates thermal characteristics graph 250, associated with top view section BB (FIG. 1A), of cooling system 100. Thermal characteristics graph 250 may represent operating temperatures associated with cooling system 100 and/or an environment that is downstream of cooling system 100 (e.g., in the direction of downstream heat sink 120). The temperatures that are associated with a downstream environment may be caused by a transfer of heat from cooling system 100 to an airflow in the direction of downstream heat sink 120. Thermal characteristics graph 250 may include a temperature topology that is identified by a group of isotherms (e.g., shown as dashed lines labeled as 68°-78° (° C.)). Thermal characteristics graph 250 may also include a group of temperature points that identify the temperature topology.

Thermal characteristics graph 250 may identify relative quantities of heat being transferred from cooling system 100 to an environment surrounding and/or downstream of heat sink 110. For example, a region associated with isotherms 68°-74° (e.g., located in the lower portion of thermal characteristics graph 250) and/or a group of temperatures points (e.g., from left to right, 68.76°, 74.80°, and/or 73.97°) may be associated with air that is being warmed by heat being emitted from heat sink 110. Another region (e.g., a downstream region) may be associated with isotherms 75°-78° (e.g., located in the middle and/or upper portion of thermal characteristics graph 250) and/or another group of temperature points (e.g., from top to bottom, 75.47°, 75.81°, 77.11°, 77.89°, 78.42°, and 77.66°). The downstream region may be associated with air that has been warmed by heat that was transferred by heat sink 110 as the air passed through and/or around heat sink 110 downstream toward downstream heat sink 120. In one example, the air associated with the downstream region may be at a temperature (e.g., $T_{DS}$) that is greater than a threshold. The threshold may be associated with a hot region (e.g., as described above with respect to FIG. 2A) and/or a temperature above which may cause damage to downstream component 210 and/or performance of downstream component 210 to degrade. In another example, the air associated with the downstream region may be associated with a temperature increase (e.g., $\Delta T$) that is greater than another threshold. The temperature difference may be based on an air temperature associated with a cold region ($T_C$) (e.g., prior to being warmed by heat sink 110) and a downstream region temperature (e.g., $T_{DS}$) (e.g., where $\Delta T \approx T_{DS} - T_C$).

Figure 3:
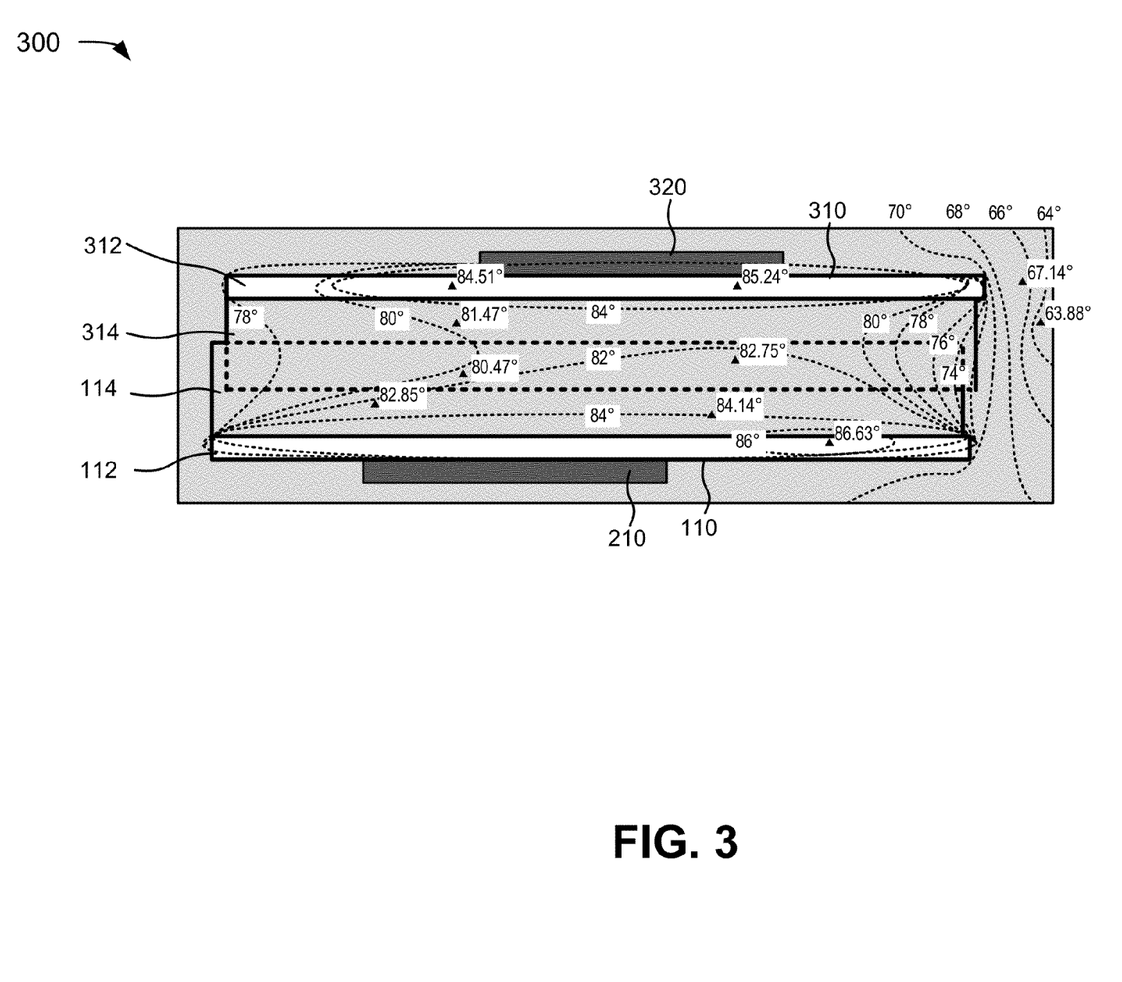
FIG. 3 is a diagram of example thermal characteristics associated with a component cooling system that includes an inverted heat sink.

FIG. 3 is a diagram of thermal characteristics graph 300 associated with cooling system 100 with an inverted heat sink. As shown in FIG. 3, cooling system 100 may include an inverted heat sink 310 on which a component 320 is mounted. Heat sink 310 may include an inverted heat sink base 312 and a group of inverted fins 314 (hereinafter referred to as "inverted fins 314"). In an example implementation, heat sink 310 may the same or similar to heat sink 110, such that inverted heat sink base 312 and/or inverted fins 314 may the same or similar to heat sink base 112 and/or fins 114, respectively.

Inverted heat sink 310 may be installed on heat sink 110 in an inverted manner (e.g., in a manner similar to that described above with respect to inverted heat sink 160 of FIG. 1B). For example, when installed, inverted base 312 may be in contact with and/or attached to all or a portion of fins 114 of heat sink 110. In another example, inverted heat sink 310 may be installed in a manner that inverted fins 314 are adjacent to and/or interlaced with fins 114 of heat sink 110.

Thermal characteristics graph 300 may represent operating temperatures associated with cooling system 100 with an installed inverted heat sink 310. Thermal characteristics graph 300 may also represent temperatures of an environment surrounding cooling system 100 with the installed inverted heat sink 310. Thermal characteristics graph 300 may include a temperature topology as identified by a group of isotherms (e.g., shown as dashed lines labeled from 64-84 (° C.)). Thermal characteristics graph 300 may also include a group of temperature points at locations at which temperature was measured with respect to cooling system 100 with the installed inverted heat sink 310.

The isotherms and/or temperature points may be used to identify relative quantities of heat, transferred from component 210 to heat sink 110 and/or from component 320 to inverted heat sink 310. The heat that is transferred to heat sink 110 and/or inverted heat sink 310 may create a hot region associated with temperatures that are higher than another region within thermal characteristics 300. For example, the hot region may be identified by one or more isotherms (e.g., isotherms associated with 74° to 84°) and/or one or more temperature points (e.g., from left to right, 82.85°, 84.51°, 81.47°, 80.47°, 84.14°, 82.75°, 85.24°, and 86.63°). The hot region may indicate that heat is being transferred from component 210 and/or component 320 to heat sink 110 and/or inverted heat sink 310.

Additionally, thermal characteristics graph 300 may identify a cool region that may indicate that inverted heat sink 310 acts as a thermal shield that blocks and/or reflects heat that may otherwise be transferred into the surrounding environment. For example, the cool region may be identified by another one or more isotherms (e.g., isotherms associated with 64° to 72°) and/or another one or more temperature points (e.g., 67.14 and/or 63.88). The cool region may indicate that heat is not being transferred (e.g., due to the blocking and/or shielding by inverted heat sink 310) from heat sink 110 and/or inverted heat sink 310 to the surrounding environment. Additionally, or alternatively, the cool region may also indicate that air flow through the hot region is impeded, which may reduce cooling performance associated with cooling system 100 with the installed inverted heat sink 310.

Figure 4A:
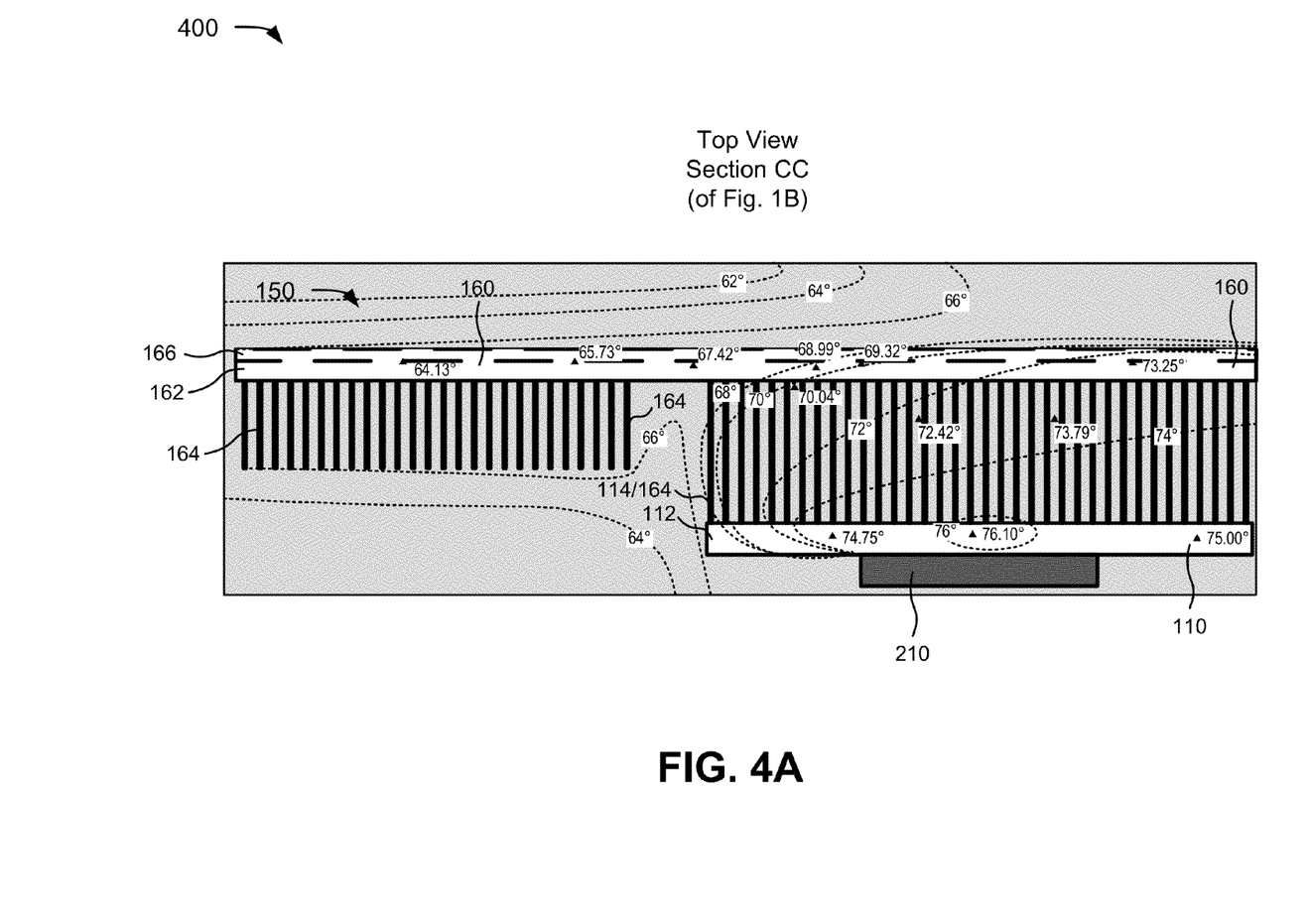
FIGS. 4A and 4B are diagrams of example thermal characteristics associated with a modified component cooling system of FIG. 1B.

FIGS. 4A and 4B are diagrams of example thermal characteristics graphs 400 and 450, respectively, of modified cooling system 150 (FIG. 1B). As shown in FIG. 4A, thermal characteristics graph 400 may be associated with side view section CC (FIG. 1B) of modified cooling system 150. Thermal characteristics graph 400 may represent operating temperatures associated with modified cooling system 150 and/or an environment that surrounds modified cooling system 150 as a result of heat being transferred from component 210. Thermal characteristics graph 400 may include a temperature topology as identified by a group of isotherms (e.g., shown as dashed lines that are labeled from 62°-76° (° C.)). Thermal characteristics graph 400 may also a group of temperature points, within side view section CC, where temperature was measured.

Thermal characteristics graph 400 may identify relative quantities of heat, transferred from component 210, at various locations of modified cooling system 150. For example, the heat that is transferred to heat sink 110 and/or inverted heat sink 160 may create a hot region associated with temperatures that are higher than another region within thermal characteristics graph 400. The hot region may, for example, be identified by an area associated with one or more isotherms (e.g., isotherms associated with 70° to 76°) and/or one or more temperature points (e.g., from left to right, 70.04°, 74.75°, 72.42°, 76.10°, 73.79°, 73.25°, and/or 75.00°). The hot region may indicate that heat is being transferred from component 210 to heat sink 110 and/or inverted heat sink 160.

Thermal characteristics graph 400 may identify relative quantities of heat that are transferred from the hot region to a cool region via inverted heat sink 160. For example, a portion of inverted base 162 and/or a portion of inverted fins 164 may exist within a region (e.g., a cool region) that is cooler than the hot region. The cool region may be identified by an area adjacent to the portion of inverted fins 164 and/or associated with one or more isotherms (e.g., 64° and 66°) (e.g., on the lower left portion of thermal characteristics graph 400). The cool region may also be associated with one or more temperature points (e.g., 64.13°, 65.73°, and/or) 67.42° on a portion of inverted base 162 to which the portion of inverted fins 164 are attached. The portion of inverted base 162 and/or the portion of fins 164, that are located within the cool region, may enable a portion of the heat, that is associated with the hot region, to be transferred (e.g., as heat flux ($HF_{EXTRACT}$)) to the cool region via the portion of inverted base 162 and/or heat pipes 166. The transferred heat may be transferred into the cool region via the portion of inverted fins 164. The transfer of heat may cause temperatures associated with the hot region, of modified cooling system 150, to be lower than temperatures associated with another hot region associated with cooling system 100 (e.g., as shown by thermal characteristics graph 200 of FIG. 2A).

Thermal characteristics graph 400 may identify a manner in which inverted heat sink 160 shields and/or blocks heat that would otherwise be transferred into the surrounding environment. For example, another cool region may be identified by another area associated with another one or more isotherms (e.g., 62°, 64°, and/or 66°) that are located above inverted heat sink 162. (e.g., on the upper portion of thermal characteristics graph 400). The other cool region may indicate that inverted heat sink 160 is trapping heat, within modified cooling system 150, in a manner similar to that described above (e.g., with respect to FIG. 3). The trapped heat may be transferred, by cooling system 150, to the cool zone via inverted heat sink 160. The trapped heat may cause temperatures associated with the other cool region, of modified cooling system 150, to be lower than temperatures associated with an environment surrounding cooling system 100 (e.g., as shown by thermal characteristics graph 200 of FIG. 2A).

Figure 4B:
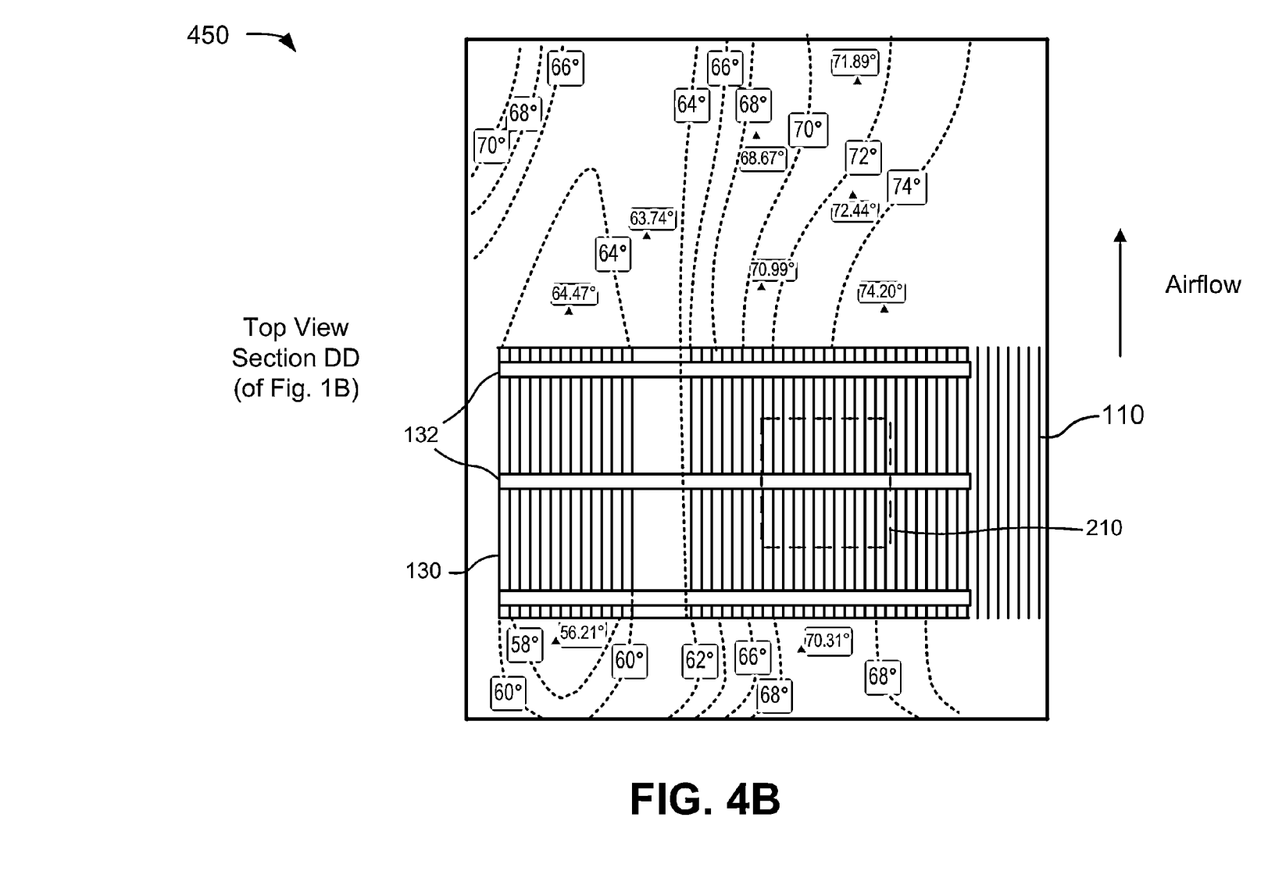

FIG. 4B illustrates thermal characteristics graph 450, associated with top view section DD (FIG. 1B), of modified cooling system 150. Thermal characteristics graph 450 may represent operating temperatures associated with modified cooling system 150 and/or an environment that is downstream of modified cooling system 150 (e.g., in the direction of downstream heat sink 120). The temperatures that are associated with a downstream environment may be caused by a transfer of heat from modified cooling system 150 to an airflow in the direction of downstream heat sink 120. Thermal characteristics graph 450 may include a temperature topology that is identified by a group of isotherms (e.g., shown as dashed lines labeled from 58°-74° in increments of 2° (° C.)). Thermal characteristics graph 450 may also include a group of temperature points that identify the temperature topology.

Thermal characteristics graph 450 may identify relative quantities of heat being transferred from heat sink 110 to an environment surrounding and/or downstream of heat sink 110. For example, a region (e.g., a cool region) may be an area associated with isotherms 58°-66° (e.g., associated with a left portion of thermal characteristics graph 450) and/or a group of temperatures points (e.g., from bottom to top, 56.21°, 64.47° and/or 63.74°). A portion of modified cooling system 150 may, in a manner similar to that described above (e.g., with respect to FIG. 4A), enable heat absorbed from heat sink 110 to be transferred to the cool region. Another region (e.g., a downstream region) may be another area, associated with isotherms 68°-74°, that is downstream of heat sink 110 (e.g., located in the upper middle to upper right portion of thermal characteristics graph 450) and/or another group of temperature points (e.g., from top to bottom, 71.89°, 68.67°, 72.44°, 70.99°, and/or 74.20°). The downstream region may be associated with air that has been warmed by heat that was transferred by modified cooling system 150 as the air passes through an environment surrounding cooling system 150 and/or downstream toward downstream heat sink 120. Additionally, thermal characteristics graph 450 may indicate that a temperature, associated with the downstream region (e.g., $T_{DSM}$), may be less than a temperature (e.g., $T_{DS}$, as identified in FIG. 2B) associated with a region that is downstream of cooling system 100 (FIG. 1A) (e.g., $T_{DSM}<T_{DS}$). The reduced temperature may indicate, for reasons stated above (e.g., with respect to FIG. 4A), that heat, which would otherwise transfer and/or flow into the downstream region, has been dissipated into the cool region via modified cooling system 150.

Modified cooling system 150 may enable the temperature associated with the downstream region (e.g., $T_{DSM}$) to be reduced to a level that is lower than a threshold. Reducing the temperatures to the level that is lower than the threshold may prevent damage to downstream component 210 and/or performance degradation of downstream component 210.

Figure 5A:
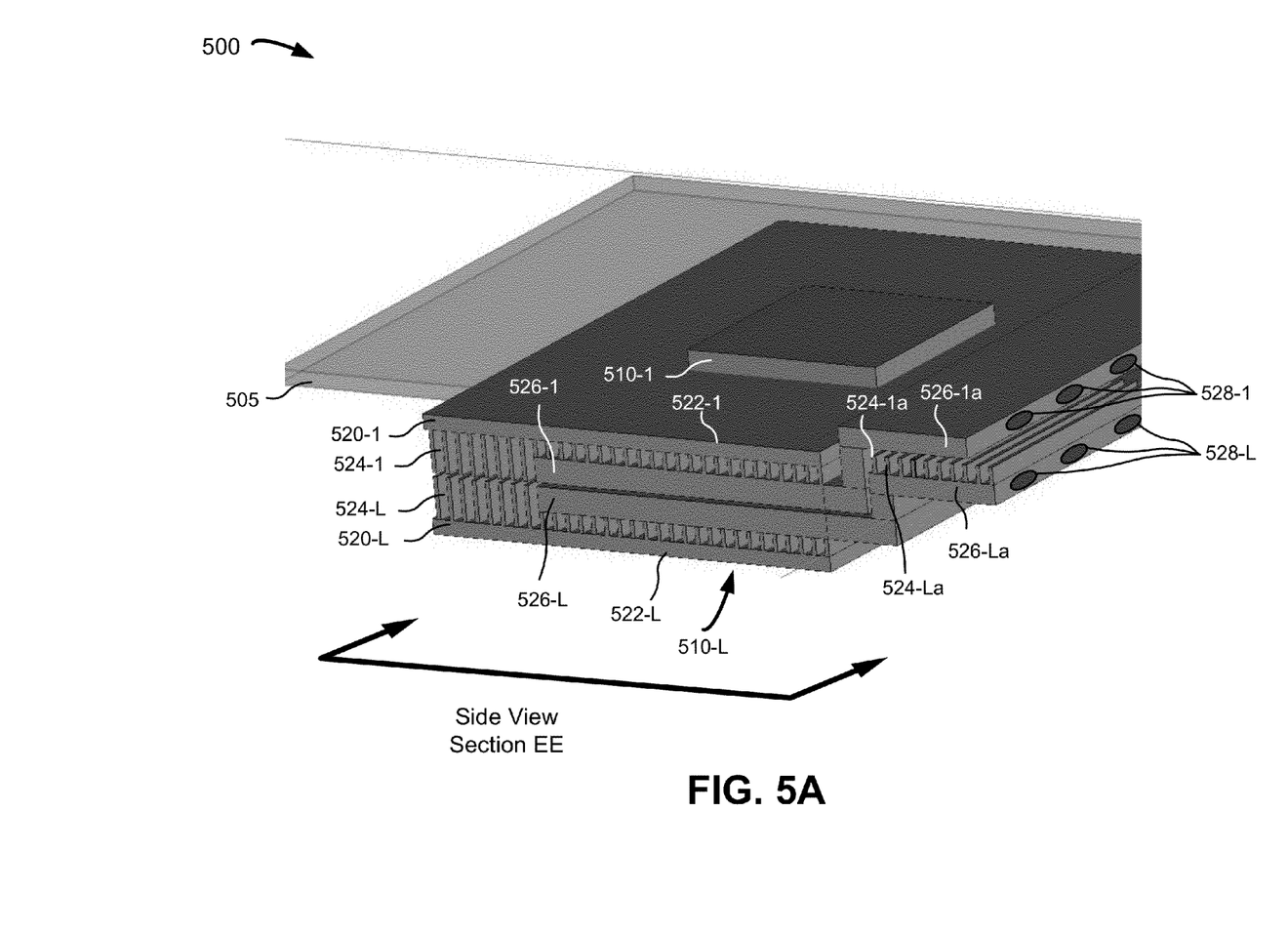
FIG. 5A is a diagram of an example stacked component cooling system according to an implementation described herein.

FIG. 5A is a diagram of an example stacked network device component cooling system 500 (hereinafter referred to as "stacked cooling system 500") according to an implementation described herein. Stacked cooling system 500 may include a collection of components, devices, and/or systems, such as a common base plate 505 (hereafter referred to as "common base 505"), a group of components 510-1, . . . , 510-L (where L≥1) (hereinafter referred to collectively as "components 510" and individually as "component 510"), and a group of modified cooling systems 520-1, . . . , 520-L (hereinafter referred to collectively as "modified cooling systems 520" and individually as "modified cooling system 520"). The number of components, devices, and/or systems, illustrated in FIG. 5A, is provided for explanatory purposes only. In practice, there may be additional components, devices, and/or systems; fewer components, devices, and/or systems; different components, devices, and/or systems; or differently arranged components, devices, and/or systems than illustrated in FIG. 5A. Also, in some implementations, one or more of the components, devices, and/or systems of stacked cooling system 500 may perform one or more functions described as being performed by another one or more of the components, devices, and/or systems of stacked cooling system 500.

Common base 505 may be a material of sufficient dimensions and/or rigidity to permit component 510 and/or modified cooling system 520 to be mounted. Common base 505 may, in one example, act as a heat sink that dissipates heat absorbed from component 510 and/or modified cooling system 520. Common base 505 may, in one example, be a heat sink base. In another example, common base 505 may include a vapor chamber. In yet another example, common base 505 may include one or more heat pipes.

Component 510 may include one or more components, associated with a network device, that generate heat when operating. In one example, component 510 may be a chip that houses an integrated circuit, such as a microprocessor, an ASIC, a FPGA, etc. Component 510 may be mounted to modified cooling system 520 to which the heat, that is generated while operating, is to be transferred. Modified cooling system 520 may be a modified cooling system (e.g., modified cooling system 150) that absorbs and/or dissipates heat, received from component 510. Modified cooling system 520 may absorb and/or dissipate the heat in a manner that does not cause a heat flux to increase temperatures, associated with a downstream component, to a level that is greater than a threshold. For example, modified cooling system 520 may include a heat sink base 522, a group of fins 524 (hereinafter referred to as "fins 524"), an inverted base 526, and/or a group of heat pipes 528 (hereinafter referred to as heat pipes 528").

Heat sink base 522 may, in a manner similar to that described above with respect to heat sink 110, be a component that is capable of being mounted to component 510 in a manner that enables heat sink base 522 to absorb heat that is generated and/or emitted by component 510. Fins 524 may, in a manner similar to that described above (e.g., with respect to fins 114 and/or inverted fins 164, of FIGS. 1A and/or 1B, respectively), include a group of plates that are secured to heat sink base 522 and/or inverted heat sink base 526 (hereinafter referred to as "inverted base 526") and which are capable of absorbing heat and/or transferring heat between inverted base 526, heat sink base 522 and/or other fins 524 (e.g., associated with another modified cooling system 520).

Inverted base 526 may, in a manner similar to that described above (e.g., with respect to inverted base 162 of FIG. 1B), include one or more components that are capable of absorbing heat that is generated and/or emitted by component 510 via heat sink base 522 and/or fins 524. Inverted base 526 may installed in a manner that enables heat to be transferred from fins 524 to inverted base 526. Inverted base 162 may include heat pipes 528. Heat pipes 528 may, in a manner similar to that described above (e.g., with respect to heat pipes 166 of FIG. 1B), include one or more components that are capable of controlling a manner and/or direction in which heat is transferred. In an example implementation, heat pipes 528 may exist within a material associated with inverted based 526. For example, heat pipes 528-1 may transfer heat from a portion of inverted heat sink 526-1 that is installed on and/or in contact with fins 524-1 to another portion of inverted base 526-1 (e.g., inverted base portion 526-1a). Inverted base portion 526-1a may be attached to a portion of fins 524-1 (e.g., fins portion 524-1a) in a manner that enables the heat, that is transferred from heat pipes 528, to be transferred, via fins portion 524-1a, into an environment that surrounds fins portion 524-1a and/or inverted portion 526-1a. In one example, the environment that surrounds fins portion 524-1a and/or inverted portion 526-1a may be located in a cool region into which heat, that has been trapped by inverted base 526-1, is transferred.

Stacked cooling system 500 may enable more than one modified cooling system 520 to be in installed in a stacked configuration. Stacked cooling system 500 may enable additional cooling capacity to be added to a network device without expanding a mounting area (e.g., on common base 505) associated with modified cooling system 520-L. The additional cooling capacity may be added, to stacked cooling system 500, by installing one or more additional modified cooling systems 520 to modified cooling system 520-L.

Installing the one or more additional modified cooling systems 520, in a manner that precludes expanding the mounting area associated with modified cooling system 520-L, may enable common base 505 to be used. Using common base 505 may preclude using multiple bases and/or customized bases for each of the one or more modified cooling systems 520 to be installed. Further, a cost associated with common base 505 may be less than another cost associated with the multiple bases and/or customized bases.

Figure 5B:
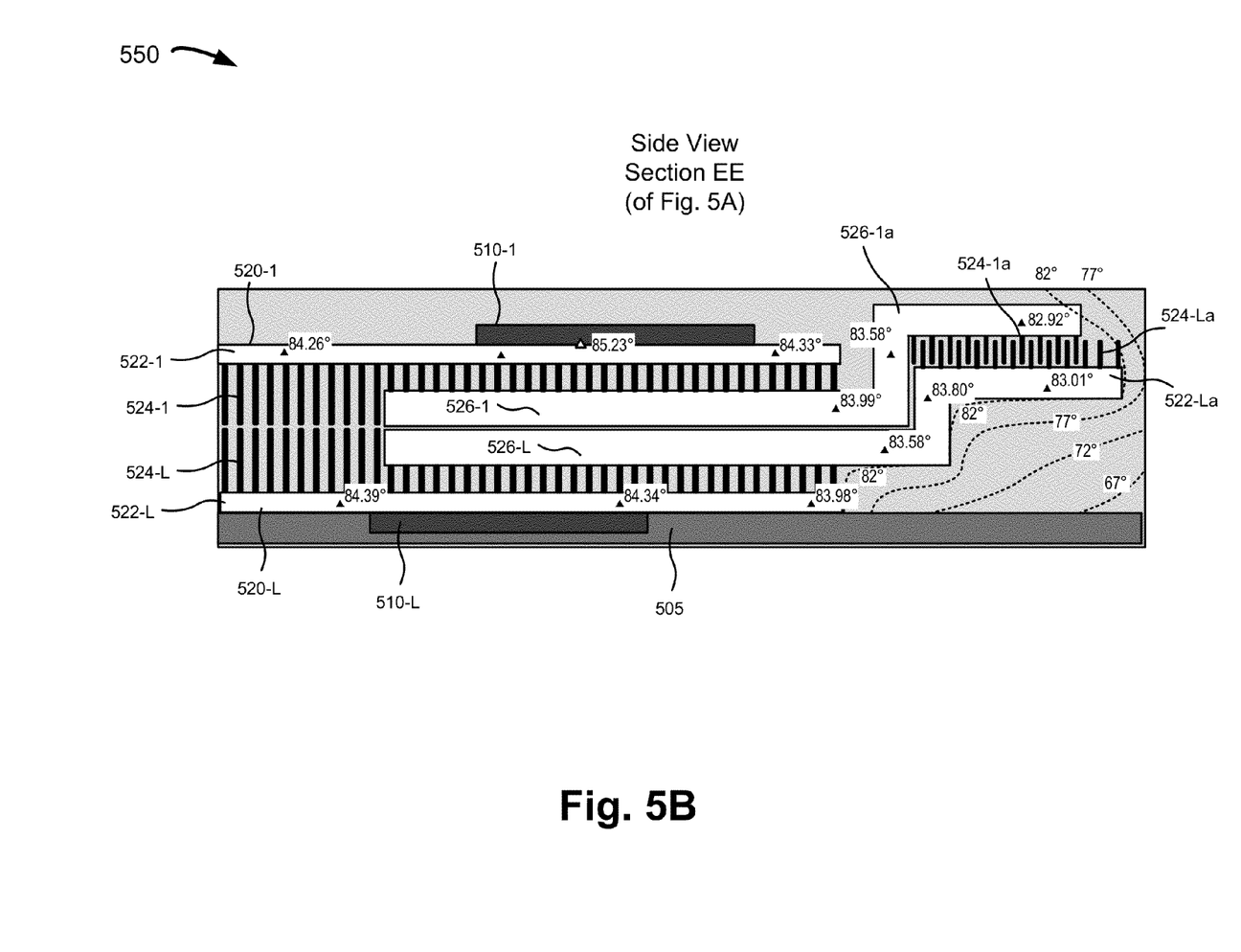
FIG. 5B is a diagram of example thermal characteristics associated with the stacked component cooling system, of FIG. 5A.

FIG. 5B is a diagram of thermal characteristics graph 550 of stacked cooling system 500 (FIG. 5A). As shown in FIG. 5B, thermal characteristics graph 550 may be associated with side view section EE (FIG. 5A) of stacked cooling system 500. Thermal characteristics graph 550 may represent operating temperatures associated with stacked cooling system 500 and/or an environment that surrounds stacked cooling system 500 as a result of heat being transferred from one or more components 510. Thermal characteristics graph 550 may include a temperature topology as identified by a group of isotherms (e.g., shown as dashed lines that are labeled from 67°-82° (° C.) in 5 degree increments). Thermal characteristics graph 550 may also include a group of temperature points, at locations within side view section EE, where temperature was measured.

Thermal characteristics graph 550 may identify relative quantities of heat, transferred from components 510, at various locations of stacked cooling system 500. For example, the heat that is transferred to heat sinks 522 and/or inverted heat sinks 526 (e.g., via fins 524) may create a hot region associated with temperatures that are higher than another region within thermal characteristics graph 550. The hot region may, for example, be identified by an area associated with one or more isotherms (e.g., an area to the left of an isotherm associated with 82°) and/or one or more temperature points that are greater than 82° (e.g., 84.26°, 84.39°, 85.23°, 84.33°, 83.98°, 83.99°, 85.58°, 85.38°, 83.80°, 82.92 and/or 83.01°).

Thermal characteristics graph 550 may identify relative quantities of heat that are transferred from the hot region to a cool region via stacked cooling system 500. The hot region may indicate that heat is being transferred from components 510-1 and/or 510-L to heat sinks 522-1 and/or 522-L, respectively. Additionally, the hot region may indicate that a portion of the heat, transferred to heat sinks 522, has been transferred to inverted bases 526-1 and/or 526-L, respectively (e.g., via fins 524-1 and/or 524-L, respectively). Further, the hot region may indicate that a portion of the heat, transferred to inverted bases 526, may be transferred, via heat pipes 528-1 and/or 528-L, to inverted base portions 526-1a and/or 526-La, respectively. A portion of the heat, associated with the hot region, may be trapped, within stacked cooling system 500, in a manner similar to that described above (e.g., with respect to FIG. 4B) by heat sinks 522 and/or inverted bases 526. Trapping the portion of the heat may prevent the portion of the heat from impinging on a downstream component. Additionally, or alternatively, the heat that was transferred to inverted base portions 526-1a and 526-La may be transferred into another region (e.g., a cool region), via fins portion 524-1a and/or 524-La, respectively.

The cool region may be identified by an area adjacent to the inverted base portions 522-1a and/or 522-La, and/or associated with one or more isotherms associated with 67°, 72°, and/or 77° (e.g., on a right and/or lower right portion of thermal characteristics graph 450). Inverted base portions 522-1a and/or 522-La, that are located within and/or adjacent to the cool region, may enable a portion of the trapped heat and/or heat that that was transferred via heat pipes 528 to be transferred (e.g., as heat flux ($HF_{EXTRACT}$)) into the cool region. Transferring the heat into the cool region may cause temperatures, associated with the hot region, to be reduced to a level that is less than a threshold.

Systems and/or methods, described herein may enable heat, that is generated by a component, to be dissipated in a cooling system in a manner that reduces a quantity of heat that impinges on a downstream component. The systems and/or methods may enable additional cooling capacity and/or an additional cooling system to be added to a network device in a manner that does not include increasing a mounting area for the additional cooling capacity and/or additional cooling system.

The foregoing description provides illustration and description, but is not intended to be exhaustive or to limit the embodiments to the precise form disclosed. Modifications and variations are possible in light of the above teachings or may be acquired from practice of the embodiments.

Even though particular combinations of features are recited in the claims and/or disclosed in the specification, these combinations are not intended to limit the disclosure of the embodiments. In fact, many of these features may be combined in ways not specifically recited in the claims and/or disclosed in the specification.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A cooling system implemented within a device, the cooling system comprising:
   a heat sink to absorb heat that is generated by a component of the device, where the heat sink includes:
      a first heat sink base to dissipate the heat, and
      a first plurality of fins via which the heat, that is dissipated by the first heat sink base, is transferred; and
   an inverted heat sink to receive the heat via the first plurality of fins, where the inverted heat sink includes:
      a second heat sink base to ensure that a portion of the heat, that transfers into an environment in which another component associated with the device is located, does not cause a temperature, associated with the environment, to increase to a first level that is greater than a first threshold,
      one or more heat pipes to transfer another portion of the heat, that does not transfer into the environment, to a portion of the second heat sink base, and
      a second plurality of fins to:
         receive the other portion of the heat via the portion of the second heat sink base, and
         transfer the other portion of the heat to another environment to prevent a temperature, associated with the component, from increasing to a second level that is greater than a second threshold.

2. The cooling system of claim 1, where the first heat sink base is mounted to the component or to a base plate on which the component is mounted.

3. The cooling system of claim 1, where the first heat sink base is made of a material that includes a coefficient of thermal conductivity that is greater than a threshold.

4. The cooling system of claim 1, where the second heat sink is made of a material that includes a coefficient of thermal conductivity that is greater than a threshold and where the second heat sink includes a vapor-chamber within the material.

5. The cooling system of claim 1, where the second heat sink acts as a thermal shield to prevent a further portion of the heat from transferring into the environment, where the further portion of the heat:
   is associated with a quantity of heat that is greater than another quantity of heat associated with the portion of the heat, or
   causes the temperature associated with the environment to increase to the first level that is greater than the first threshold.

6. The cooling system of claim 1, where one or more heat pipes are embedded within or attached to the second heat sink.

7. The cooling system of claim 1, where, when receiving the heat via the first plurality of fins, the inverted heat sink is further to:
    receive the heat via a portion of the second plurality of fins, where the portion of the second plurality of fins is in contact with or adjacent to all or a portion of the first plurality of fins.

8. The cooling system of claim 1, where the inverted heat sink is installed in a manner that does not cause a mounting area, associated with the first heat sink, to increase.

9. The cooling system of claim 1, further comprising:
    another heat sink to absorb other heat that is generated by a further component; and
    another inverted heat sink to receive the other heat from the other heat sink, where the other inverted heat sink is to:
        prevent a portion of the other heat, that transfers into the environment, from causing the temperature, associated with the environment, to increase to the level that is greater than the first threshold, or
        transfer another portion of the other heat, that does not transfer into the environment, into the other environment to prevent a temperature, associated with the further component, from increasing to third level that is greater than a third threshold.

10. The cooling system of claim 9, where other heat sink and the other inverted heat sink are installed in a stacked configuration, where the stacked configuration enables the other heat sink and the other inverted heat sink to be installed in a manner that does not increase a mounting area associated with the heat sink.

11. The cooling device of claim 9, where other heat sink and the other inverted heat sink are installed in a manner that does not include an additional base plate on which to mount the other heat sink or the other inverted heat sink.

12. A cooling system implemented within a device, the cooling system comprising:
    a base on which to mount a first component of the device;
    one or more heat sinks to dissipate heat that is generated by one or more components, where at least one of the one or more heat sinks is mounted to the base that creates a mounting area to which the first component is mounted; and
    one or more inverted heat sinks installed on the one or more heat sinks in a manner that does not increase the mounting area, where each of the one or more inverted heat sinks is to:
        receive a respective portion of the heat that is dissipated by the one or more heat sinks,
        block part of the respective portion of the heat from being transferred to an airflow that is incident on a second component, of the one or more components, where blocking the part of the respective portion of the heat prevents performance of the second component from degrading, and
        transfer another part of the respective portion of the heat to another airflow to cool the each of the one or more inverted heat sinks, where cooling the each of the one or more inverted heat sinks enables the one or more components to operate at a temperature that is lower than a threshold.

13. The cooling system of claim 12, where each heat sink, of the one or more heat sinks, includes a respective heat sink base to:
    receive the respective portion of the heat that is generated by a respective component, of the one or more components, and
    distribute the respective portion of the heat within a base material associated with the heat sink base.

14. The cooling system of claim 13, where each heat sink, of the one or more heat sinks includes a respective plurality of fins to:
    increase a quantity of surface area, associated with the each heat sink, that enables the respective portion of the heat to be transferred to a respective inverted heat sink, of the one or more inverted heat sinks, that corresponds to the each heat sink.

15. The cooling system of claim 12, where each of the one or more inverted heat sinks includes a respective heat sink base,
    where the respective heat sink base includes:
        a plurality of fins to receive, from a respective heat sink of the one or more heat sinks, the respective portion of the heat, and
    where the respective heat sink base is to:
        distribute the respective portion of the heat within a vapor chamber associated with the respective heat sink base.

16. The cooling system of claim 15, where the respective heat sink base is to:
    block a respective quantity of heat, associated with some or all of the respective portion of the heat, from being transferred into the airflow, where blocking the respective quantity of heat enables a temperature, associated with the airflow, to be lower than another threshold.

17. The cooling system of claim 15, where the respective heat sink base further includes:
    a plurality of heat pipes to transfer some or all of the respective portion of the heat to another plurality of fins, associated with the respective heat sink base, that enables some or all of the respective portion of the heat to be transferred into the other airflow.

18. The cooling system of claim 12, where the base includes:
    a solid base made of a thermally conductive material, or
    one or more vapor chambers associated with one or more cavities within the thermally conductive material.

19. A cooling system implemented within a device, the cooling system comprising:
    a base on which a component is mounted, the base being made of a thermally conductive material that includes a vapor chamber;
    one or more heat sinks that include one or more heat sink bases and one or more groups of fins, where a particular heat sink, of the one or more heat sinks, is mounted to the base within a mounting area in which the component is mounted, and where a particular heat sink base, associated with the particular heat sink, is connected to at least one group of fins of the one or more group of fins; and
    one or more inverted heat sinks that include one or more inverted heat sink bases and one or more groups of inverted fins, where a first inverted heat sink of the one or more inverted heat sinks:
        is mounted to the base in a manner that does not increase the mounting area,
        includes a first inverted heat sink base, of the one or more inverted heat sink bases, on which another component is mounted,
        includes a particular group of inverted fins, of the one or more groups of inverted fins, the particular group of inverted fins being connected to a portion of the first inverted heat sink base, and
        one or more heat pipes associated with the first inverted heat sink.

20. The cooling system of claim 19, where the one or more inverted heat sinks or the one or more heat sinks are mounted to the base in a manner that does not increase the mounting area.

21. The cooling system of claim 19, where the one or more inverted heat sinks or the one or more heat sinks are mounted to the base in a manner that precludes using additional bases to mount the one or more inverted heat sinks or one or more other heat sinks.

22. The cooling system of claim 19, where at least one of the one or more inverted heat sinks is a vapor chamber-based heat sink.

23. The cooling system of claim 19, where the one or more inverted heat sinks or the one more heat sinks are made of the thermally conductive material or another thermally conductive material, and
where the thermally conductive material or the other thermally conductive material are associated with a coefficient of thermal conductivity that is less than a threshold.

24. The cooling system of claim 19, where one or more other components are mounted to all or a portion of the one or more inverted heat sink bases.

* * * * *